(12) United States Patent
Chung et al.

(10) Patent No.: US 11,978,819 B2
(45) Date of Patent: May 7, 2024

(54) OPTICAL SENSING DEVICE

(71) Applicant: Silergy Semiconductor Technology (Hangzhou) LTD, Zhejiang (CN)

(72) Inventors: Weichun Chung, Hangzhou (CN); Suyi Lin, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 17/224,286

(22) Filed: Apr. 7, 2021

(65) Prior Publication Data

US 2021/0328088 A1 Oct. 21, 2021

(30) Foreign Application Priority Data

Apr. 16, 2020 (CN) .......................... 202010297930.3

(51) Int. Cl.
- *H01L 31/12* (2006.01)
- *H01L 31/02* (2006.01)
- *H01L 31/0216* (2014.01)

(52) U.S. Cl.
CPC ...... *H01L 31/125* (2013.01); *H01L 31/02024* (2013.01); *H01L 31/02162* (2013.01)

(58) Field of Classification Search
CPC ............. H01L 31/125; H01L 31/02024; H01L 31/02162; H01L 31/02322; H01L 31/02325; H01L 31/02327

USPC .......................................................... 257/81
See application file for complete search history.

(56) References Cited

U.S. PATENT DOCUMENTS

| | | | |
|---|---|---|---|
| 9,361,609 B2 | 6/2016 | Franklin et al. | |
| 9,805,630 B2 | 10/2017 | Franklin et al. | |
| 9,820,355 B2* | 11/2017 | Jia | G01J 1/0242 |
| 2008/0043491 A1 | 2/2008 | Lin | |
| 2009/0242370 A1 | 10/2009 | Chiang | |
| 2012/0294579 A1 | 11/2012 | Chen | |
| 2014/0055408 A1 | 2/2014 | Liu et al. | |
| 2014/0126238 A1 | 5/2014 | Kao et al. | |
| 2014/0226361 A1 | 8/2014 | Vasylyev | |
| 2016/0307881 A1* | 10/2016 | Ho | H01L 31/173 |
| 2017/0184778 A1 | 6/2017 | Onda et al. | |
| 2017/0250169 A1* | 8/2017 | Mehrl | H01L 25/167 |
| 2019/0146135 A1 | 5/2019 | Lin | |

FOREIGN PATENT DOCUMENTS

CN 105302286 A 2/2016

* cited by examiner

*Primary Examiner* — Calvin Y Choi

(57) ABSTRACT

An optical sensing device can include: a semiconductor having a photosensitive region; an optical structure located above the photosensitive region; and where the optical structure comprises alternately stacked light-filtering layers and light-transmitting layers, in order to block large-angle incident light from entering the photosensitive region.

20 Claims, 6 Drawing Sheets

OPTICAL SENSING DEVICE

RELATED APPLICATIONS

This application claims the benefit of Chinese Patent Application No. 202010297930.3, filed on Apr. 16, 2020, which is incorporated herein by reference in its entirety.

FIELD OF THE INVENTION

The present invention generally relates to the field of semiconductor technology, and more particularly to optical sensing devices.

BACKGROUND

The main principle of the proximity sensor application is that the reference light source emits a light, the light is reflected by an object, and then is received by a photodiode (PD) to convert the light energy into an electrical signal. The distance between the object and a package can be determined by the strength of the electrical signal (light energy), whereby the signal strength is strong when the object is near the package, and the signal strength is weak when the object is far from the package.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In some applications, the light energy received by the PD may not only come from the reflection of the detected object, but also from the reflection of other non-detected objects. This light that is reflected by the non-detected object is called crosstalk. Excessive crosstalk can seriously affect application of the light sensing system. Generally, the source of crosstalk is the reflection of the appearance of the terminal product (e.g., housing, glass cover, lens, etc.), so the crosstalk is mostly large-angle reflected light.

Figure 1:
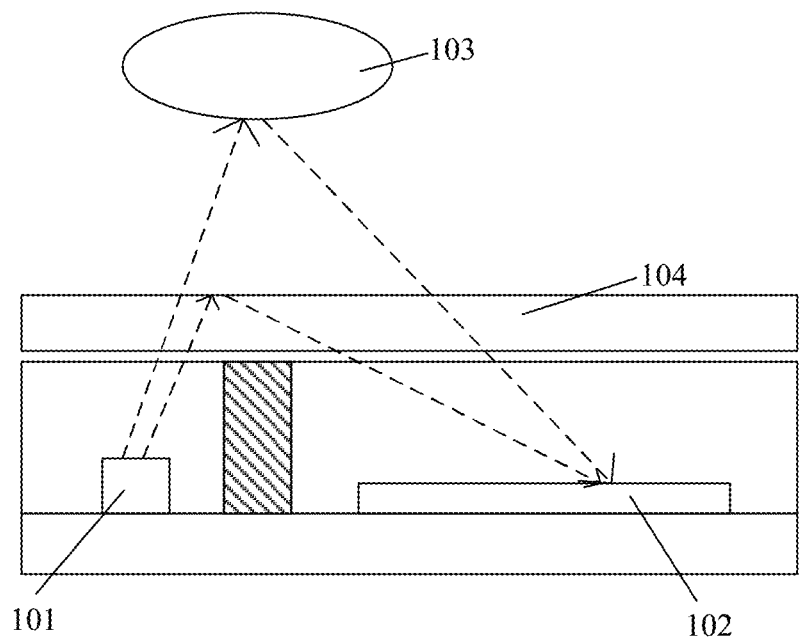
FIG. 1 is a sectional view diagram of an example optical sensing device.

Referring now to FIG. 1, the proximity sensor can include light-emitting element 101 and photosensitive element 102. The light emitted by light-emitting element 101 may be reflected by the object to be detected 103, and then received by photosensitive element 102 and converted into an electrical signal, in order to detect the distance of the object. However, photosensitive element 102 may also receive the light reflected from cover 104 at the same time. Such reflected light may generally be large-angle reflected light, which can directly affect the sensing of the distance of the object by photosensitive element 102. In addition, the received light energy of the proximity sensor may be inversely proportional to the square of the distance between the proximity sensor and the detected object in this case. Therefore, when the object is extremely close to the proximity sensor, the light energy is infinite, which is called the "full count" phenomenon.

In particular embodiments, an optical sensing device is provided, and can include a semiconductor with a photosensitive region; and an optical structure located above the photosensitive region. For example, the optical structure can include alternately stacked light-filtering layers and light-transmitting layers to block large-angle incident light from entering the photosensitive region, in order to reduce crosstalk.

Figure 2:
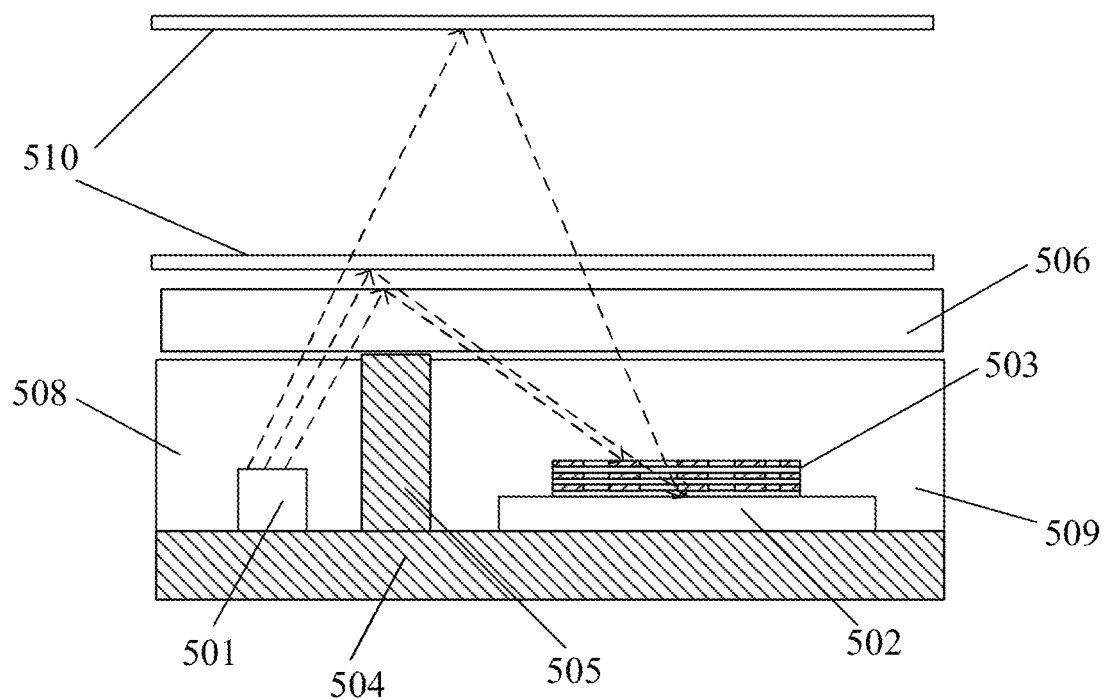
FIG. 2 is a sectional view diagram of an example optical sensing device, in accordance with embodiments of the present invention.

Referring now to FIG. 2, shown is a sectional view diagram of an example optical sensing device, in accordance with embodiments of the present invention. In this particular example, the optical sensing device can include light-emitting element 501, semiconductor 502 with a photosensitive region, and optical structure 503 located above the photosensitive region. For example, optical structure 503 can include alternately stacked light-filtering layers and light-transmitting layers, in order to block large-angle incident light from entering the photosensitive region. Moreover, optical structure 503 can include at least two layers of light-filtering layers, and one layer of light-transmitting layer.

For example, the light emitted by light-emitting element 501 may reach the surface of object 510 to be detected, and can be reflected by object 510 to be detected. Then, the reflected light may enter the photosensitive region through optical structure 503. The semiconductor with the photosensitive region can convert the reflected light signal into an electrical signal, in order to detect the distance between the object to be detected and the optical sensing device. Since the reflected light may include large-angle crosstalk light, when the reflected light passes through the optical structure, the optical structure can reflect or absorb the large-angle crosstalk light to not substantially reach the photosensitive region, in order to reduce optical crosstalk.

The crosstalk light can include light reflected by an object that is not the object intended to be detected. For example, the crosstalk light can include light reflected by cover 506, whereby the light emitted by light-emitting element 501 is reflected by cover 506, and then the reflected light passes through optical structure 503. Optical structure 503 can reflect or absorb the reflected light so as to not reach the photosensitive region, in order to reduce optical crosstalk and improve the accuracy of the optical sensing device. In particular embodiments, the semiconductor with a photosensitive region is a photodiode. In other examples, the semiconductor can be other optoelectronic structures. In another embodiment, the optical sensing device may only include semiconductor 502 and optical structure 503.

It should be noted that optical structure 503 restricts light with different angles in different proportions, including blocking a large amount of large-angle light and a small amount of small-angle light, such that the sensing device can sense the object to be detected when there is a very short distance between the object to be detected and the optical sensing device, and the full count phenomenon may not occur. In addition, the energy of the received light may not be inversely proportional to the square of the distance between the optical sensing device and the detected object.

In particular embodiments, the optical sensing device can also include substrate 504. Light-emitting element 501 and semiconductor 502 with a photosensitive region can be attached to a first surface of substrate 504 through an adhesive layer. The optical sensing device can also include baffle 505 located between light-emitting element 501 and semiconductor 502. Baffle 505 can block interference of the light emitted by light-emitting element 501 on the light reflected by the object to be detected. Baffle 505 can be separately formed on substrate 504, or can be integrally formed with substrate 504. Further, the optical sensing device can include encapsulation body 508 for encapsulating light-emitting element 501, and encapsulation body 509 for encapsulating semiconductor 502. Cover 506 can be located above encapsulation bodies 508 and 509.

Figure 3:
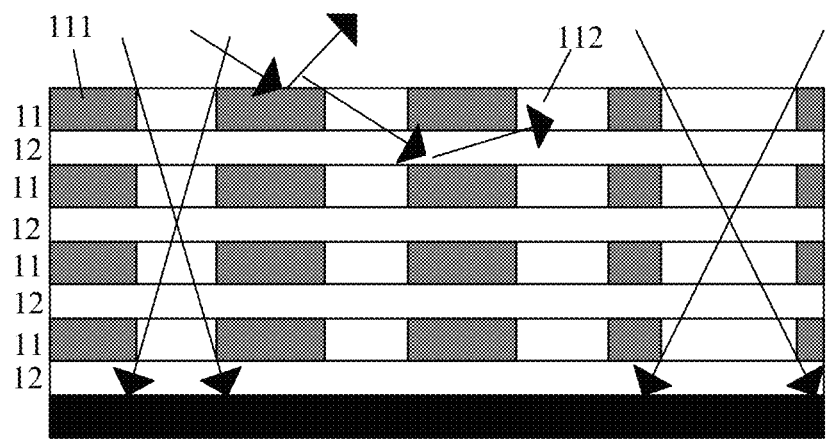
FIG. 3 is a sectional view diagram of the optical structure of a first example optical sensing device, in accordance with embodiments of the present invention.
Figure 4:
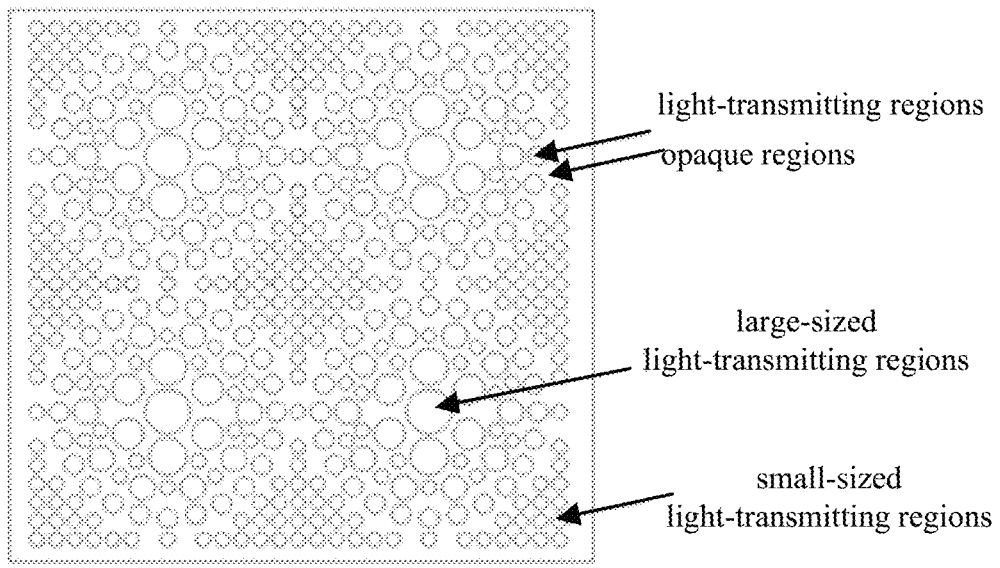
FIG. 4 is a top view diagram of the optical structure of the first example optical sensing device, in accordance with embodiments of the present invention.

Referring now to FIGS. 3 and 4, shown are sectional and top view diagrams of the optical structure of a first example optical sensing device, in accordance with embodiments of the present invention respectively. The optical structure can include alternately stacked light-filtering layers 11 and light-transmitting layers 12. Light-filtering regions 11 can include light-transmitting regions 112 and opaque regions 111. Each light-filtering layer 11 can include at least two light-transmitting regions. When the incident light reaches the optical structure, most of the small-angle incident light can directly pass through light-transmitting regions 112 and light-transmitting layers 12 to reach the semiconductor. In addition, most of the large-angle incident light can be reflected by the opaque regions, and then reflected out of the optical sensing device through the light-transmitting region, in order to not reach the photosensitive region, thus reducing optical crosstalk.

In particular embodiments, light-transmitting layers 12 and light-transmitting regions 112 of light-filtering layers 11 can include a dielectric, such as silicon oxide or other oxides. Opaque regions 111 of light-filtering layers 11 can include metals, such as aluminum alloy, copper alloy, or others. In addition, the metal and the metal circuitry around the photosensitive region can be the same metal material, and may also be formed synchronously with the metal circuit around the photosensitive region. That is, the metal in the opaque regions and the metal circuitry around the photosensitive region can be formed at substantially the same time and/or by the same step. In other examples, the opaque regions of light-filtering layer can be black photoresists for absorbing the large-angle incident light, in order to prevent the large-angle incident light from reaching photosensitive region. In particular embodiments, the thickness of each layer of the light-filtering layers is the same (e.g., from about 0.4 to about 0.6 microns), and the thickness of each layer of light-transmitting layers is the same (e.g., from about 0.6 to about 0.7 microns).

In addition, when light-transmitting regions 112 are set to one size, only light with a larger angle than the angle limited by this size can be blocked, which may reduce the optical crosstalk. However, when the light reflected by the object to be detected is at a relatively close distance (e.g., when the distance between the optical sensing device and the object to be detected is relatively close), and is with an angle that is larger than the limited angle, the object to be detected may not be detected. Therefore, the relationship between the light energy and the distance between the optical sensing device and the detected object in particular embodiments can be substantially the same as that between the light energy and the distance between the optical sensing device and the detected object in other approaches.

In particular embodiments, there may be at least two sizes of light-transmitting regions 112 of each layer of light-filtering layers. This can greatly reduce the passing of large-angle light (e.g., near-distance light signals) passing through, and also reduce a small amount of the small-angle light (e.g., long-distance light signals). Thus, short-distance optical signal sensing can be performed; that is, the optical sensing device can sense the object to be detected at a very close distance. Further, the number of large-sized light-transmitting regions of each layer of light-filtering layers may not be greater than that of the small-sized light-transmitting regions of each layer of light-filtering layers.

Referring now to FIG. 4, shown is a top view diagram of the optical structure of a first example optical sensing device, in accordance with embodiments of the present invention. In this particular example, each layer of the light-filtering layer can include light-transmitting regions and opaque regions. The light-transmitting regions of each layer of light-filtering layers can be arranged in regular patterns in a predetermined order. In addition, the number of large-sized light-transmitting regions of each layer of light-filtering layers may not be greater than that of the small-sized light-transmitting regions of each layer of light-filtering layers. Since there are at least two sizes of the light-transmitting regions on each layer of light-filtering layers, the number of the smaller size of light-transmitting regions can be greater, and the number of the larger size of light-transmitting regions fewer. In certain embodiments, any suitable arrangement of light-transmitting regions of the light-filtering layer, and not limited to this particular example, can be utilized.

In particular embodiments, the size of the corresponding light-transmitting region of each layer of light-filtering layers can be the same in a stacking direction, and the corresponding light-transmitting regions of each layer of light-filtering layers may be aligned in the stacking direction. It should also be noted that due to process or design errors, there may be deviations or dislocations at positions of the light-transmitting regions corresponding to each layer of light-filtering layers, in some cases.

In particular embodiments, the greater the number of stacked layers is, the greater the thickness of each layer of light-filtering layers, the less large-angle light can pass through the optical structure, and which also can increase the size of the optical structure. Therefore, the number of stacked layers can be set according to particular applications. Further, the thickness of each layer of light-filtering layers, the thickness of each layer of light-transmitting layers, and the spacing between the light-transmitting regions, can also be set according to particular applications. In particular embodiments, the shapes of the light-transmitting regions of each layer of the light-filtering layers can be circles. In other examples, the shapes of the light-transmitting regions of each layer of the light-filtering layers can be polygons, squares, triangles, and so on.

Figure 5A:
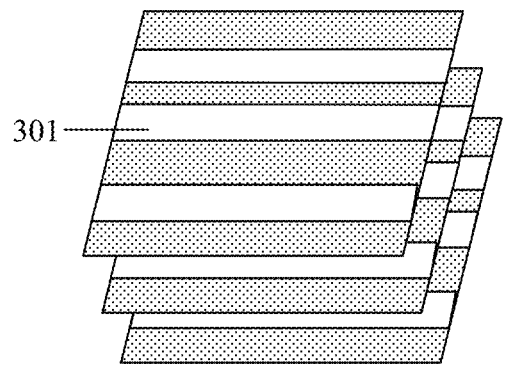
FIGS. 5A and 5B are stacking diagrams of two kinds of light-filtering layers of the optical structure of a second example optical sensing device, in accordance with embodiments of the present invention.
Figure 5B:
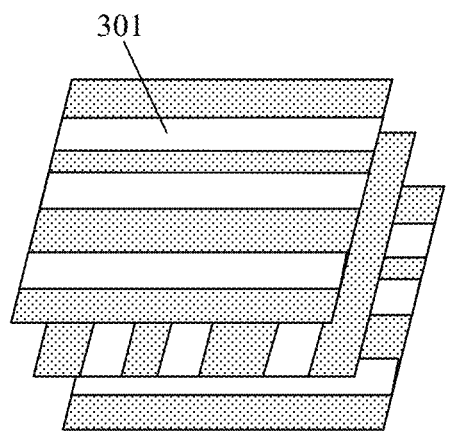

Referring now to FIGS. 5A and 5B, shown are stacking diagrams of two kinds of light-filtering layers of the optical structure of a second example optical sensing device, in accordance with embodiments of the present invention. As compared with the first example, the shapes of light-transmitting regions 301 of each layer of the light-filtering layers can be a strip-shaped structure. That is, light-transmitting regions 301 can include at least two strip-shaped structures at intervals, and each strip-shaped structure may extend from a first end of the light-filtering layer to a second end that is opposite to the first end. In FIG. 5A, each layer of the light-filtering layers is parallel; that is, the corresponding light-transmitting regions of each layer of light-filtering layers can align in the stacking direction.

In FIG. 5B, in a stacking direction, each layer of the light-filtering layers can be arranged in a staggered arrangement, such that the strip-shaped structures of the adjacent light-filtering layers cross in the length direction, and where the cross is a non-contact cross of the adjacent light filter layers. For example, in a stacking direction, each layer of the light-filtering layers can be arranged in a staggered arrangement, such that the strip-shaped structures of the adjacent light-filtering layers are vertical in a length direction, where the vertical is a non-contact vertical. In particular embodiments, the widths of the strip-shaped structures can be the same and the spacing between the strip-shaped structures can be the same. In other embodiments, the widths of the strip-shaped structures and the spacing between the strip-shaped structures can be different.

Figure 6A:
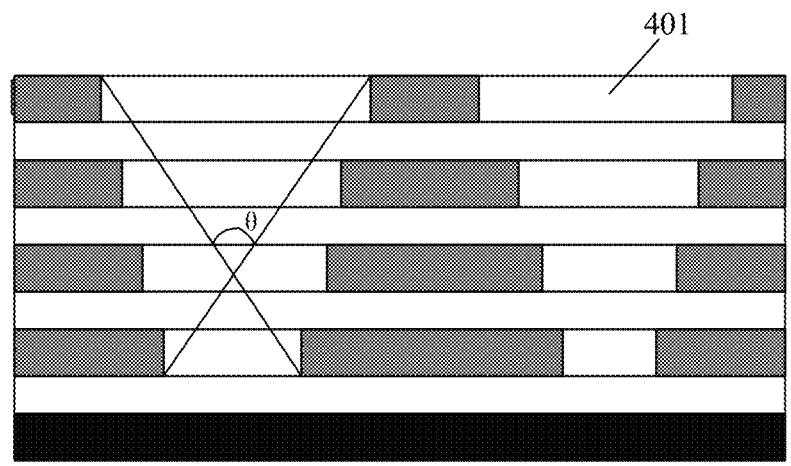
FIGS. 6A and 6B are sectional view diagrams of two kinds of optical structures of a third example optical sensing device, in accordance with embodiments of the present invention.
Figure 6B:

Referring now to FIGS. 6A and 6B, shown are sectional view diagrams of two kinds of optical structures of a third example optical sensing device, in accordance with embodiments of the present invention. As compared with the first example, the size of corresponding light-transmitting regions 401 of each layer of light-filtering layers can change in a gradual form in the stacking direction. In FIG. 6A, the size of corresponding light-transmitting regions 401 of each layer of light-filtering layers can be increased from the top layer of light-filtering layer to the bottom layer of light-filtering layer gradually in the stacking direction. In FIG. 6B, the size of corresponding light-transmitting regions 401 of each layer of light-filtering layer can be decreased from the top layer of light-filtering layer to the bottom layer of light-filtering layer gradually in the stacking direction. Also, the maximum angle of the incident light that can pass through the optical structure in this example can be determined by the angle θ between the cross-connecting lines of the top layer and the bottom layer of the light-transmitting regions.

Particular embodiments provide an optical sensing device. The optical structure in the optical sensing device can block a large-angle incident light from entering the photosensitive region through stacked light-filtering layers and light-transmitting layers, such that optical crosstalk can be reduced without other light blocking devices. In this way, the size of the optical sensing device, as well as process costs, can be reduced. In addition, when the object to be detected is relatively close to the optical sensing device, since there are at least two sizes of the light-transmitting region on each layer of light-filtering layer, the ratio of the large-angle incident light and the small-angle incident light passing through the optical structure can be controlled, in order to avoid a full count phenomenon. Further, the opaque regions of light-filtering layer can include the same metal as the metal circuitry that surrounds the semiconductor with the photosensitive region, thereby reducing additional design costs.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An optical sensing device, comprising:
   a) a semiconductor element having a photosensitive region;
   b) an optical structure located above the photosensitive region;
   c) wherein the optical structure comprises alternately stacked light-filtering layers and light-transmitting layers, in order to block large-angle incident light from entering the photosensitive region, wherein each layer of the light-filtering layers has a same thickness, and wherein opaque regions in each of the light filtering layers are vertically aligned at each vertical side thereof such that thicknesses thereof fully overlap in a vertical direction; and
   d) a baffle arranged between a light-emitting element and the semiconductor element, wherein the baffle extends to a cover of the optical sensing device.

2. The optical sensing device of claim 1, wherein light emitted by the light-emitting element is reflected by an object to be detected that is outside the optical sensing device, and then the reflected light enters the photosensitive region through the optical structure.

3. The optical sensing device of claim 2, wherein the large-angle light is substantially crosstalk light.

4. The optical sensing device of claim 3, wherein the crosstalk light comprises light reflected by an object that is not to be detected.

5. The optical sensing device of claim 3, wherein the cover is located above the light-emitting element and the semiconductor element, and wherein the crosstalk light comprises light reflected by the cover.

6. The optical sensing device of claim 1, wherein the light-filtering layer comprises a light-transmitting region and an opaque region.

7. The optical sensing device of claim 6, wherein the opaque region reflects the large-angle incident light to block the large-angle incident light from passing through the optical structure.

8. The optical sensing device of claim 6, wherein the opaque region absorbs the large-angle incident light to block the large-angle incident light from passing through the optical structure.

9. The optical sensing device of claim 6, wherein there are at least two sizes of the light-transmitting regions on each light-filtering layer.

10. The optical sensing device of claim 6, wherein a number of large-sized light-transmitting regions of each light-filtering layer is not greater than a number of small-sized light-transmitting regions of each light-filtering layer.

11. The optical sensing device of claim 6, wherein shapes of the light-transmitting regions of the light-filtering layer are circles or polygons.

12. The optical sensing device of claim 6, wherein shapes of the light-transmitting regions of the light-filtering layer are strip-shaped.

13. The optical sensing device of claim 6, wherein a size of each light-transmitting region of each light-filtering layer is the same.

14. The optical sensing device of claim 13, wherein each light-transmitting region of each light-filtering layer is aligned in a stacking direction.

15. The optical sensing device of claim 6, wherein a size of each light-transmitting region of each light-filtering layer increases from a top layer to a bottom layer in a stacking direction.

16. The optical sensing device of claim 6, wherein a size of each light-transmitting region of each light-filtering layer decreases from a top layer to a bottom layer in a stacking direction.

17. The optical sensing device of claim 12, wherein in a stacking direction, adjacent light-filtering layers are arranged in a staggered arrangement, such that the strip-shaped structures of adjacent light-filtering layers cross in a length direction, wherein the cross is a non-contact cross.

18. The optical sensing device of claim 12, wherein in a stacking direction, adjacent light-filtering layers are arranged in a staggered arrangement, such that the strip-shaped structures of adjacent light-filtering layers are vertical in a length direction, wherein the vertical is a non-contact vertical.

19. The optical sensing device of claim 1, wherein the light-transmitting regions of each light-filtering layer are arranged in regular patterns in a predetermined order.

20. The optical sensing device of claim 6, wherein the opaque regions of each layer of light-filtering layers comprises a metal.

* * * * *